United States Patent [19]

Roy

[11] Patent Number: 4,878,198

[45] Date of Patent: Oct. 31, 1989

[54] STATIC RAM WITH COMMON DATA LINE EQUALIZATION

[75] Inventor: Richard S. Roy, Pleasanton, Calif.

[73] Assignee: Visic, Incorporated, San Jose, Calif.

[21] Appl. No.: 148,279

[22] Filed: Jan. 25, 1988

[51] Int. Cl.⁴ .................. G11C 7/00; G11C 29/00
[52] U.S. Cl. .................................. 365/222; 365/201; 365/189.02; 365/230.02
[58] Field of Search ............... 365/189.02, 203, 222, 365/230.02

[56] References Cited

U.S. PATENT DOCUMENTS

| | | | |
|---|---|---|---|
| 4,355,377 | 10/1982 | Sud et al. | 365/203 X |
| 4,494,221 | 1/1985 | Hardee et al. | 365/203 X |
| 4,592,026 | 5/1986 | Matsukawa et al. | 365/203 X |
| 4,616,344 | 10/1986 | Nogudi et al. | 365/203 X |
| 4,638,462 | 1/1987 | Rajeevakuman et al. | 365/203 X |
| 4,646,272 | 2/1987 | Takasugi | 365/233 X |
| 4,764,901 | 8/1988 | Sakurai | 365/189 X |

OTHER PUBLICATIONS

System Design/Integrated Circuits—Computer Design—vol. 22, No. 3, Mar. 1983, "The Chip That Refreshes Itself" by Fallin et al., pp. 111–122.

Primary Examiner—Stuart N. Hecker
Assistant Examiner—Alfonso Garcia
Attorney, Agent, or Firm—Flehr, Hohbach, Test, Albritton and Herbert

[57] ABSTRACT

A static random access memory having a plurality of pairs of common data out lines. A plurality of bit line pairs are coupled to each pair of common data out lines. The common data out lines are automatically equalized at the end of each memory access cycle, and the accessed bit lines are automatically equalized at the end of each write cycle. Thus, the process of equalizing the common data out lines is removed from the critical timing path for accessing the memory, which eliminates one of the primary problems in the use of address transition detection in static memory devices.

7 Claims, 5 Drawing Sheets

STATIC RAM WITH COMMON DATA LINE EQUALIZATION

The present invention relates generally to semiconductor memory devices, and particularly to static MOS memory devices.

BACKGROUND OF THE INVENTION

As the density of fast, static MOS random access memories (RAMs) continues to increase, the capacitance of the bit lines and common data out lines increases proportionately, thereby increasing the time required to generate an adequate differential signal to be read by a sense amplifier, and also the time required to write an adequate signal into a memory cell.

Common data out lines are lines which couple a selected pair of bit lines to a sense amplifier. Thus they act as the common output path for a multiplicity of bit lines. In some memory devices, these lines act as common data lines for both reading and writing data and are therefore called "common data lines" in those devices. The present invention can be used with both types of common data lines.

Referring to FIG. 1, in the first generation of fast, static MOS RAMs (SRAMs), fast access time was achieved by the use of d.c. (NMOS depletion mode) pull ups 20 and 22 on the bit lines BL and BLB to limit signal swing during read operations. This limited the amount of voltage differential (sometimes called slew) which the memory cells needed to generate on the bit lines BL-BLB and common data out lines CDO-CDOB. One major problem with this approach is that these memory devices have long write recovery times (i.e., the access time of the first read after a write operation), because the bit line pull ups 20 and 22 are not able to quickly equalize the bit lines after the much larger write differential voltage has been written onto the bit lines. This makes the effective cycle time for alternate read and write cycles longer than is possible for successive read cycles or for successive write cycles.

Another penalty imposed by the use of d.c. bit line pull ups is the contention between the pull up devices and the pull down devices 24 and 26 used during write cycles. This extends the length of time required to write data into the memory, and more importantly, wastes a considerable amount of power. In fact, the amount of power wasted during writing and reading has made this approach unsuitable for use in higher density memories.

Referring to FIG. 2, more recent, asynchronous fast static RAMs have used address transition detection (ATD) to generate bit line equalization signals EQ and EQB, and to temporarily disable the sense amplifier clock signal SA at the beginning of memory access cycles, thereby allowing the use of higher impedance bit line loads—or no d.c. loads at all. This has reduced the average power consumed and also the minimum required write pulse (i.e, the length of time required to write data into the memory).

One penalty of this approach is the large $I_{cc}$ current spike during equalization. For example, this current spike would exceed 1 ampere for a device with 256 bit lines each having a capacitance of 4 picofarads, a maximum voltage swing of 3 volts, and a 3 nanosecond bit line equalization time:

$$I = C\,dv/dt = 256 * 4pf * 3v/3 * 10^{-9}$$
$$= 1.024 \text{ amperes}$$

While there are techniques to reduce various components of this current spike, it is clear that as memories become faster and denser, this problem becomes more severe.

An even more critical penalty of ATD for fast, high density static RAMs is delays in the memory's access time. By requiring bit line equalization in the beginning of the access cycle, several delays are inserted into the critical timing path. Address transition has to be logically detected and then buffered to drive the large capacitive load of all the equalization, pull up, and sense amp transistors gated by the derivatives of the address transition detection (ATD) signal. Also, the equalization signal pulses must be wide enough at their destinations to guarantee adequate equalization of the bit lines and data out lines. The sum of all these delays can be a significant portion (e.g., thirty to forty percent) of the memory's access time.

In accordance with the above observations by the inventors, the primary object of the present invention is to provide mechanisms for reducing the voltage swings on the bit lines during read cycles, and for equalizing the common data out lines at the end of each access cycle, thereby eliminating a significant delay in the memory access paths of prior art static RAM devices.

SUMMARY OF THE INVENTION

In summary, the present invention is a static random access memory having a plurality of pairs of common data out lines. A plurality of bit line pairs are coupled to each pair of common data out lines. The present invention provides means for automatically equalizing the common data out lines at the end of each memory access cycle. Thus, the process of equalizing the common data out lines is removed from the critical timing path for accessing the memory, which eliminates one of the primary problems in the use of address transition detection in static memory devices.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
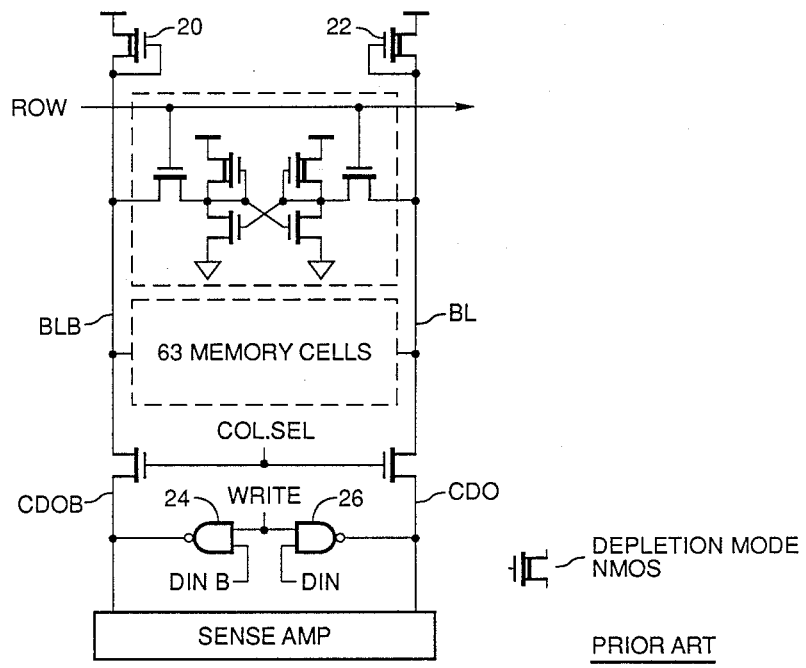
FIGS. 1, and 2 depict prior art common data out line circuit structures.
Figure 2:
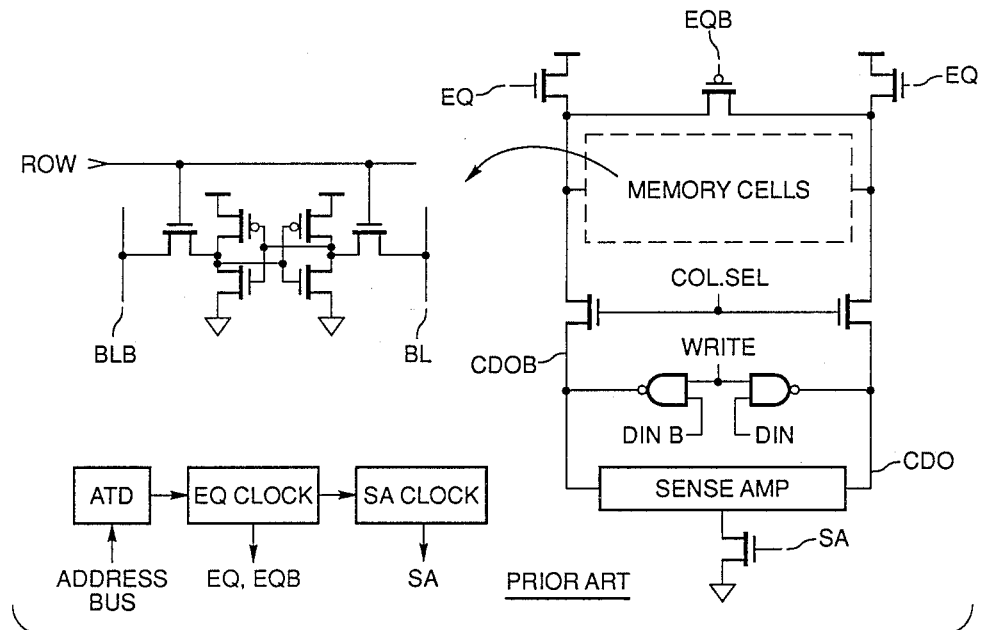
Figure 3:
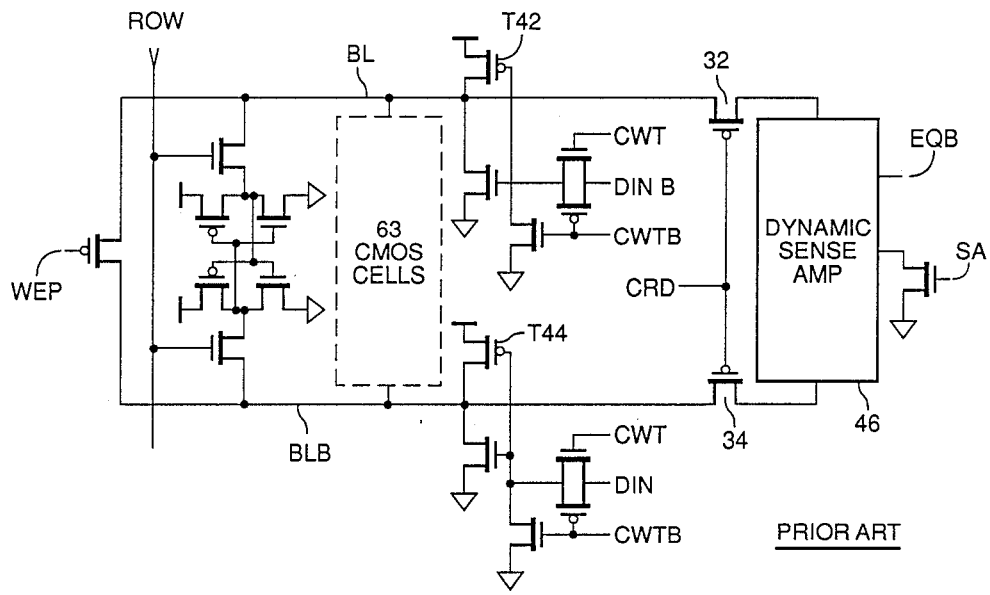
FIG. 3 depicts a static random access memory having a mechanism for automatically equalizing the bit lines at the end of each write cycle.
Figure 4:
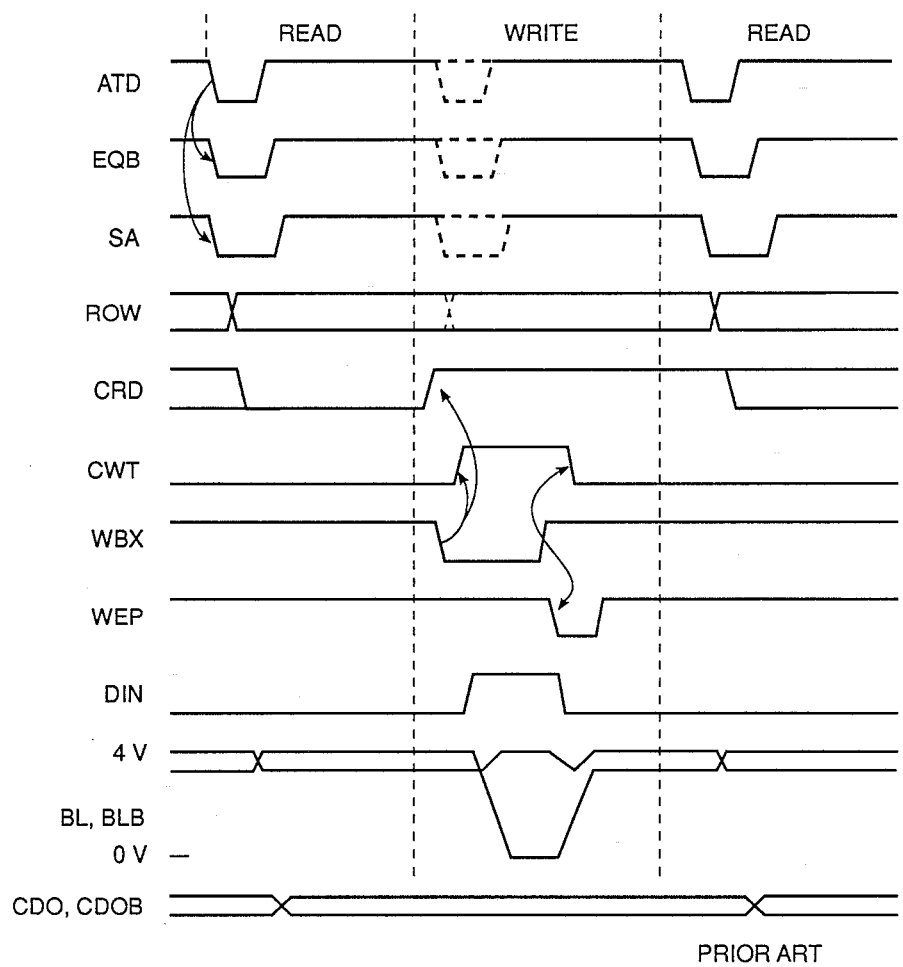
FIG. 4 is a timing diagram showing the operation of the memory device depicted in FIG. 3.

In an initial embodiment of the present invention, shown in FIG. 3, the inventors obtained a zero nanosecond write recovery period by using a write equalization pulse (WEP) at the end of each write cycle—triggered by the rising edge of WBx, as shown in the timing diagram in FIG. 4.

FIG. 3 shows a portion of a 2K×8 static RAM made by VLSI Technology Corporation of San Jose Calif. (part number VT20C18/20C19). In particular, FIG. 3 shows one column of sixty-four memory cells which are selectively coupled to a pair of common data lines by transfer devices 32 and 34 which are enabled by a column selection signal CRD (which stands for column read). The device in FIG. 3 achieves a 20 nanosecond access and cycle time.

Address transition detection is used only to deselect and equalize the device's dynamic sense amplifiers. The bit lines BL and BLB have d.c. loads T42 and T44 during read cycles, but the d.c. load connected to the "zero" bit line is disabled during write cycles (by "column write" signals CWT and CWTB and the state of the DIN and DINB signals) to allow a faster, more power efficient write operation. Since the ATD signal is not used to equalize the bit lines, the capacitance that is driven by the ATD signal and its derivatives is quite small. As a result, the ATD signal EQB, which is used to equalize the dynamic sense amplifiers 46, can be generated within the time it takes for the selection of a new row—thereby taking the ATD signal out of the critical speed path. Furthermore, as noted above, a zero nanosecond write recovery period is obtained by the use of a write equalization pulse (WEP) at the end of each write cycle—triggered by the rising edge of WBx, as shown in the timing diagram in FIG. 4.

However, the memory device depicted in FIG. 3 still has one significant delay related to voltage swings from the data levels in one cycle to the data levels in the next cycle. In particular, in the memory device shown in FIG. 3, the capacitance of the common data out lines CDO and CDOB (which can be two to three times that of the bit lines) must be driven from the old data levels at the end of one access cycle to the new data levels at the beginning of a new access cycle by the relatively low current memory cell.

COMMON DATA LINE EQUALIZATION

Figure 5:
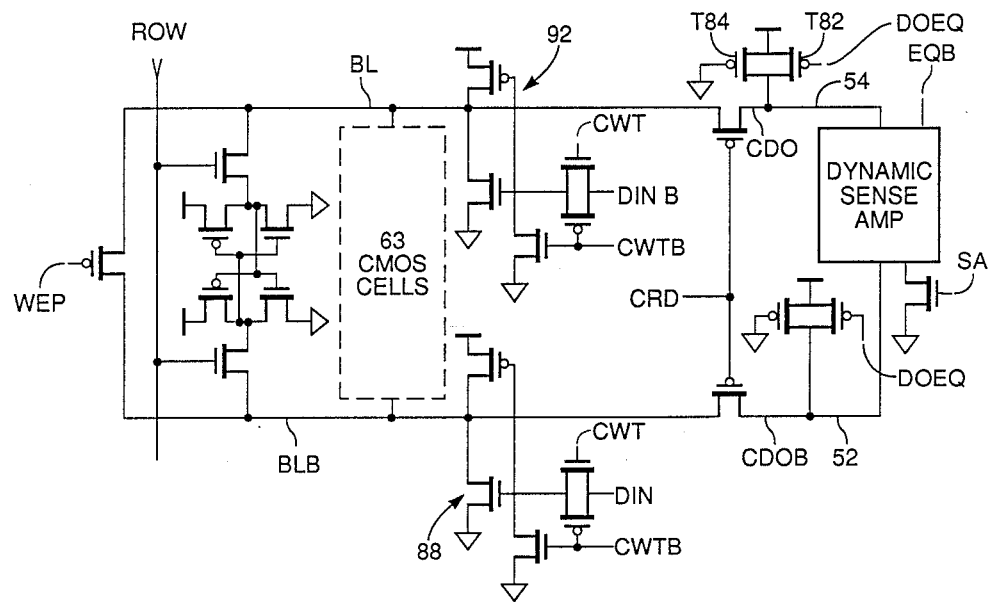
FIG. 5 depicts a portion of static random access memory having a common data out line circuit structure in accordance with the present invention.

Referring to FIG. 5, there is shown the a representative portion of the preferred embodiment of the present invention, implemented in the form of an 8k ×8 static RAM. In this memory, the access delay due to the common data out line capacitance is greatly reduced by using a "pipelined" equalization technique.

The present invention is based on the observation that the smaller the voltage swing required on a line, the faster that line can switch from one state to another. For a CDO (common data out) line with a capacitance of 1.5 pf (picofarads) that is allowed to swing 300 mV (millivolts) during a read operation, and a memory cell capable of delivering 100 μA (microamperes) to the bit and data lines, the time required to swing completely from one data state to 100 mV in the opposite direction is $$dt = C\,dv/I$$
$$= 1.5\,pf * 0.4\text{ volts}/0.1\text{ mA}$$
$$= 6.0\text{ nanoseconds}$$

By equalizing the CDO lines ahead of time, the total voltage swing is reduced to 100 mV (because the initial 300 mV differential is eliminated), and thus the data line settling time is $$dt = Cdv/I$$
$$= 1.5\,pf * 0.1\text{ volts}/0.1\text{ mA}$$
$$= 1.5\text{ nonoseconds}$$

Thus, equalizing the CDO lines ahead of time reduces the delay by 4.5 nanoseconds. In a memory device with a 20 nanosecond access time, this represents a 22.5 percent improvement in overall access time.

The simplest way to equalize the CDO lines 52 and 54 ahead of time would be to generate a pulse from the ATD signal at the beginning of the read cycle. The problem with this approach, however, is that it would introduce a delay in the critical timing path—as was explained above—because the equalization process would take longer than the selection of a new row. The solution used in the present invention is as follows.

Figure 6:
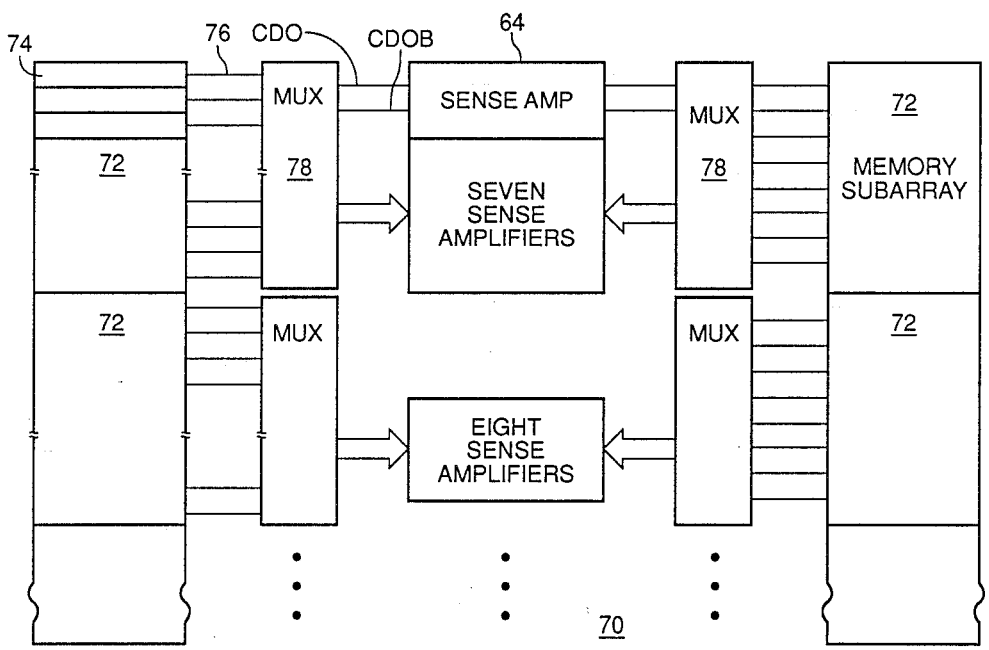
FIG. 6 is a block diagram of a memory device showing how the memory cells, bit lines and common data out lines of the memory are organized.

Referring to FIG. 6, the memory device 70 contains 64k memory cells which are accessed as an 8k ×8 array. In the preferred embodiment, the memory cells are divided into sixteen subarrays 72. Each subarray 72 contains sixty-four columns 74, and each column 74 contains sixty-four memory cells coupled to one pair of bit lines 76. A multiplexer 78 couples each subarray 72 to a single pair of common data out lines CDO and CDOB. This memory organization allows the use of bit lines with just sixty-four cells on each bit line pair, which allows the production of a memory device with very small bit line capacitances—approximately 1.0 pf per bit line in the preferred embodiment.

In the preferred embodiment, there are eight sets of sense amplifiers, each set having eight sense amplifiers. The address lines of the memory are decoded in such a way that three of the address lines are called the "block address" and only one block, i.e., one eighth of the memory, is active at any one time. Thus, only one set of the sense amplifiers is activated during each memory access cycle. Furthermore, each sense amplifier 64 is coupled to two pair of CDO lines. However, only one of the two multiplexers 78 coupled to the sense amplifier 64 is active at any one time, and the multiplexers are designed so that the capacitance of only one pair of CDO lines is present on the inputs to the sense amplifier.

In the preferred embodiment, the CDO lines have capacitances of approximately 1.5 pf, which is about 1.5 times the bit line capacitances. Given the capacitance of these CDO lines, equalizing the CDO lines after the ATD signal would significantly increase the access time of the memory.

For the benefit of those not skilled in the art, a "dynamic" sense amplifier is herein defined as a sense amplifier in which the small differential signal on the common data out lines is sampled and latched with a "sense enable" clock that is internally generated by the memory device. Subsequent changes in the CDO/CDOB signal inputs have no effect on the latched data held by the sense amplifier.

In the preferred embodiment, only the gates of the differential pair of transistors in the sense amplifier 64 are coupled to the common data out lines CDO and CDOB. As a result, the dynamic sense amplifier has no affect on the common data out lines (i.e., it draws no current from these lines, except for a manageable amount of capacitive coupling) and does not react to changes on the common data out lines after the sense amplifier has latched.

Thus, by using dynamic sense amplifiers 64, the memory 70 needs to sample the data on the CDO lines only during the brief period just before and during sensing. Once the data has been sensed, further changes in the CDO lines are ignored by the sense amplifiers and the CDO lines can be equalized during all other parts of the memory access cycle.

Referring to FIG. 5, the CDO lines in the preferred embodiment are each precharged by two P-channel devices: T82 which is activated by signal DOEQ (data out equalization), and T84 which is always on. T82 is a fairly large transistor, for precharging the CDO lines, having a channel width of approximately 25 microns and a length of 1.4 microns. T84 is a d.c. load, for limiting the swing of the CDO lines, having a channel length of 3 microns and a width of approximately 3 microns. In alternate embodiments, transistor T84 could be removed.

Each pair of CDO lines is coupled to one of eight pairs of bit lines only when the column read signal CRD of the selected columns are active. Thus, in accordance with the goal of minimizing the voltage swing of the CDO lines during the data reading process, the CRD signal is held inactive (i.e., high) and the DOEQ signal is kept active except during the data sampling period.

Figure 7:
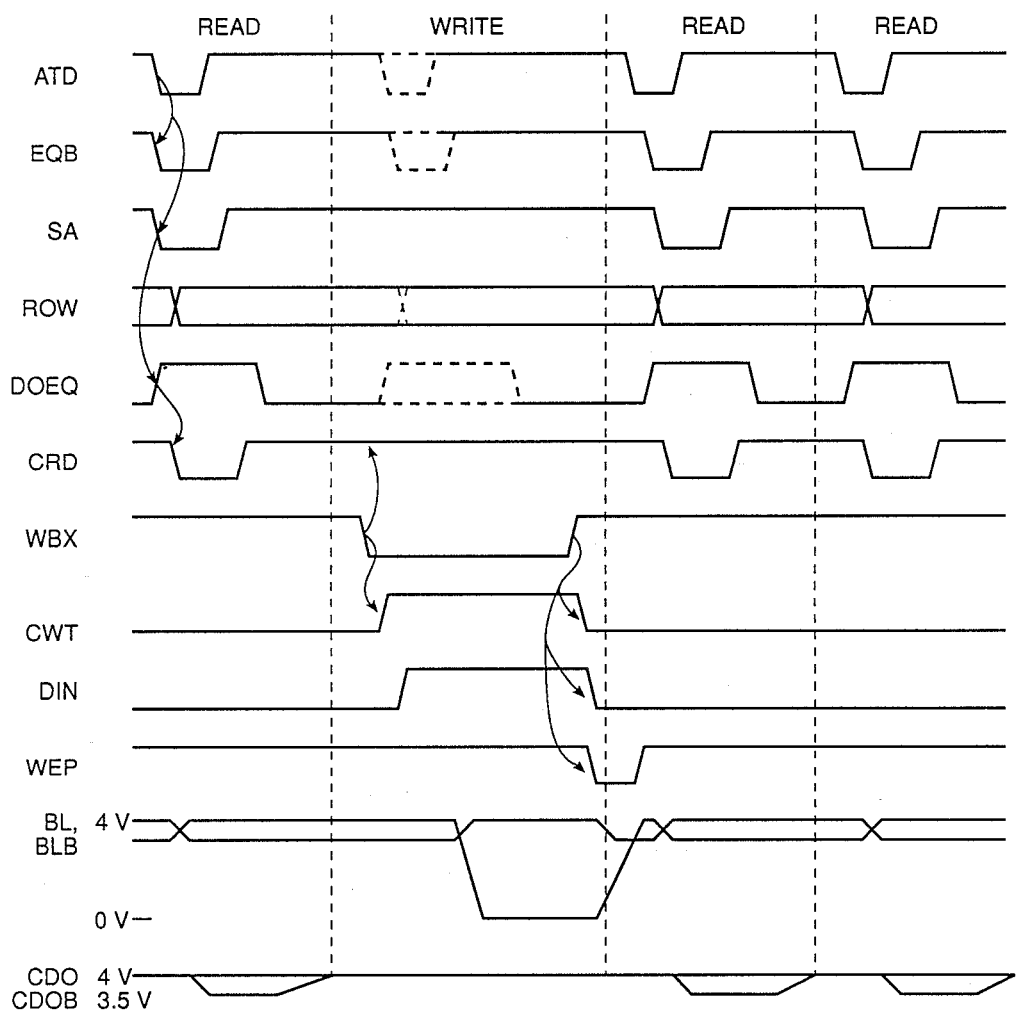
FIG. 7 is a timing diagram for the common data out line equalization circuit shown in FIG. 5.

The timing diagram in FIG. 7 shows the operation of the circuit in FIG. 5 during a read cycle, followed by a write cycle, followed by two read cycles. For the purposes of this explanation, it is assumed that CRD is the column selection signal for whichever column is selected during each memory cycle. Also, for the purposes of this explanation, it is assumed that the Vcc common power supply for the memory is a 4 volt power supply.

Looking at the first read cycle, just before an address transition is detected, the CDO lines 52 and 54 are both held high and are not coupled to bit lines BL and BLB. When an address transition is detected, the ATD signal triggers the sense amplifier's internal equalization signal EQB and temporarily deactivates the sense amplifier's pull down signal SA. At approximately the same time, DOEQ is disabled and then the column read signal CRD for the selected column is enabled so that data in the selected memory cell in that column can be sampled.

Generally, the internal clock signals are sequenced so that the CRD signal is activated shortly (approximately 0.5 to 1.0 nanoseconds) after the bit lines in the selected column begin to reflect the currently selected memory location's data value—i.e., shortly after the bit lines have "crossed" if the current data value is different that the previous data value on the bit lines. However, the memory device will work properly even if the CRD signal is activated substantially simultaneously with the crossing of the bit lines. The CDO lines, which were equalized before the ATD signal, need to swing only 100 millivolts before the data is sampled by the sense amplifier, which takes approximately 1.5 nanoseconds after the bit lines have developed a differential.

In the preferred embodiment, a margin for process variations is provided by waiting approximately two nanoseconds after the CRD signal becomes active before disabling the sense amplifier equalization signal EQB. Then, approximately four nanoseconds after the CRD signal becomes active, the sense amplifier pull down signal SA is activated. It takes the sense amplifier at most 2.5 nanoseconds to latch in the data on the CDO lines. Then, approximately two nanoseconds after the sense amplifier signal SA is activated, the column selection signal CRD is disabled and approximately two nanoseconds after that the common data line equalization signal DOEQ is activated so that the CDO lines will be equalized by the end of the current memory access cycle.

This technique allows for leisurely equalization of the CDO lines completely removed from the critical timing path, even in a memory device with a memory cycle time of 15 nanoseconds.

For the purposes of the present invention, a write cycle differs from the read cycle primarily in that the write signal WBX inhibits the column selection signal CRD, and instead, column write signals CWT and CWTB are generated by the combination of WBx derivatives and the predecoded column and block address. By preventing the generation of CRD, the capacitance of the CDO lines does not affect the data writing circuits 88 and 92. Thus new data can be written more quickly than if the CDO lines were coupled to the bit lines.

As shown in FIG. 7, after the input data has been written and the WBx signal goes high (marking the end of the write cycle), a write equalization pulse WEP is generated to equalize the bit lines in much the same was as discussed above with respect to the prior art device shown in FIG. 3.

The dashed lines for the ATD, EQB, ROW, and DOEQ signals during the write cycle show that these signals are also generated if an address transition occurs at the beginning of the write cycle. Since the common data lines are isolated from the bit lines, however, these signals have no affect on the data writing process. In one embodiment of the present invention, the SA signal is also generated in response to an address transition, but in the later embodiment shown in FIG. 7 the SA signal is suppressed by WBx. In this latter embodiment, the suppression of the SA signal reduces power consumption.

The two read cycles shown in FIG. 7 after the write cycle show the waveform of the CDO lines with back to back read cycles. As shown, since the CDO lines are equalized at the end of each read cycle, a large portion of the voltage swing of the CDO lines is removed from the critical timing path during read cycles.

Figure 8:
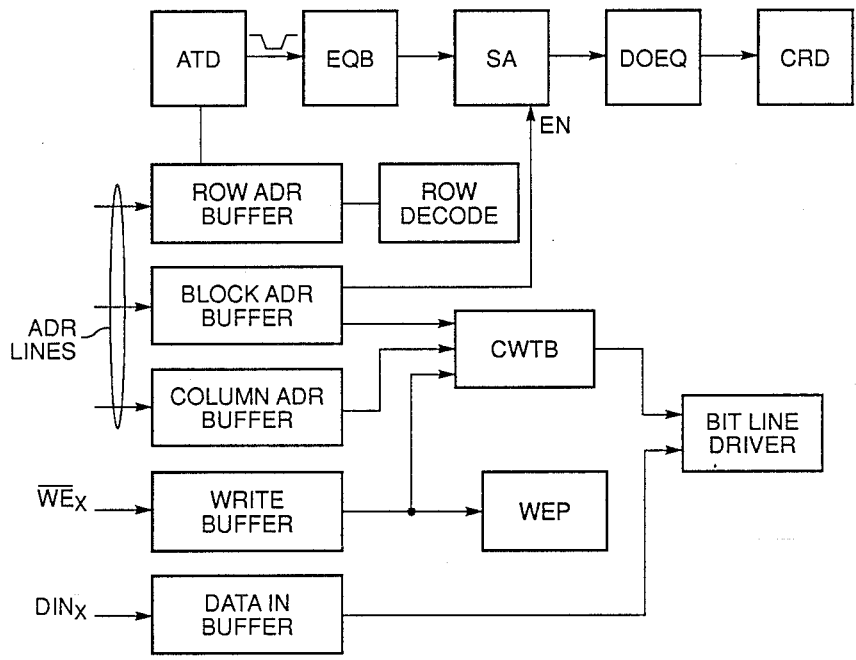
FIG. 8 is a block diagram of the clock drivers which generate the clock signals shown in FIG. 7.

FIG. 8 is a block diagram of the clock signal generators used in the preferred embodiment, showing the interconnections required to generate the signal waveforms shown in FIG. 7.

The dynamic sense amplifier used in the preferred embodiment is the subject of a copending patent application entitled DYNAMIC SENSE AMPLIFIER FOR CMOS STATIC RAM, in the name of Douglas C. Galbraith, and assigned to Visic, Inc. of San Jose, Calif., application Ser. No. 07/125,293, filed Nov. 25, 1987, which is hereby incorporated by reference.

ALTERNATE EMBODIMENTS

The CDO equalization technique described above is particularly suited for memory architectures using dynamic sense amplifiers. However, an alternate embodiment of the invention would be a memory with static sense amplifiers, latched outputs, and means for deselecting the static sense amplifiers after the outputs have been latched.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A static random access memory, comprising:
   an array of memory cells arranged in rows and columns, with the memory cells in each column coupled to a pair of differential bit lines;
   a multiplicity of sense amplifiers, and a pair of differential common data out lines coupled to each sense amplifier;
   multiplexer means for selectively coupling each said common data out line to a selected one of a predefined set of bit line pairs;
   equalization means coupled to each said pair of common data out lines for equalizing the voltage differential in each said pair of common data out lines;
   a multiplicity of address lines, and address transition detection means for generating an ATD signal when a transition occurs on any of said address lines;
   read access control means coupled to said equalization means and multiplexer means, for responding to said ATD signal by disabling said equalization means, enabling said multiplexer means and activating said sense amplifiers, and then disabling said multiplexer means and re-enabling said equalization means;
   whereby said read access control means causes said equalization means to begin equalizing each said pair of common data out lines before the end of each memory read cycle.

2. A static random access memory as set forth in claim 1, further including
   bit line equalization means coupled to each said pair of differential bit lines for equalizing each said pair of differential bit lines at the end of each write cycle performed by said memory.

3. A static random access memory as set forth in claim 1, wherein said equalization means includes precharge means for precharging both of said common data out lines in each of said pairs of common data out lines to the same voltage level when the operation of said equalization means is enabled.

4. A static random access memory, comprising:
   an array of memory cells arranged in rows and columns, with the memory cells in each column coupled to a pair of differential bit lines;
   a multiplicity of dynamic sense amplifiers, and a pair of differential common data lines coupled to each dynamic sense amplifier;
   multiplexer means coupled to each said pair of common data lines and to a predefined set of said bit line pairs, for selectively coupling each said common data line to a selected one of said predefined set of bit line pairs;
   precharging means coupled to each said pair of common data lines for precharging both common data lines to the same voltage level;
   a multiplicity of address lines, and address transition detection means for generating an ATD signal when a transition occurs on any of said address lines;
   read access control means coupled to said multiplexer means and said precharging means, for responding to said ATD signal first by disabling said precharging means and activating said multiplexer means so that each of said pairs of common data lines is coupled to a selected pair of bit lines, then by activating said sense amplifiers, and then by re-enabling said precharging means and disabling said multiplexer means so that said precharging means will precharge said common data out lines without precharging said bit lines;
   whereby said pairs of common data lines are precharged at the end of each memory read cycle.

5. A static random access memory as set forth in claim 4, further including bit line equalization means coupled to each said pair of differential bit lines for equalizing each said pair of differential bit lines at the end of each write cycle performed by said memory.

6. A method of controlling the sequence of operations in a static random access memory having an array of memory cells arranged in rows and columns, with the memory cells in each column coupled to a pair of differential bit lines, a multiplicity of address lines which receive address signals that designate selected memory cells in the array, a multiplicity of sense amplifiers, a pair of differential common data out lines coupled to each sense amplifier, and multiplexer means for selectively coupling each said common data out line to a selected one of a predefined set of bit line pairs;
   the method comprising the steps of:
   equalizing the voltages on each said pair of common data out lines;
   responding to a change in value of the address signals on at least one of said address lines by stopping said equalizing step, activating said multiplexer means so as to couple each said pair of common data out lines to a selected pair of bit lines, activating said sense amplifiers, and then disabling said multiplexer means so as to decouple said common data out lines from said bit lines, and re-equalizing the voltages on each said pair of common data out lines;
   whereby the voltages on each said pair of common data out lines begins equalizing before the end of each memory read cycle.

7. A method of controlling the sequence of operations in a static random access memory having an array of memory cells arranged in rows and columns, with the memory cells in each column coupled to a pair of differential bit lines, a multiplicity of address lines which receive address signals that designate selected memory cells in the array, a multiplicity of sense amplifiers, a pair of differential common data out lines coupled to each sense amplifier, and multiplexer means for selectively coupling each said common data out line to a selected one of a predefined set of bit line pairs;
   the method comprising the steps of:
   precharging each said pair of common data out lines;

responding to a change in value of the address signals on at least one of said address lines by stopping said precharging step, activating said multiplexer means so as to couple each said pair of common data out lines to a selected pair of bit lines, activating said sense amplifiers, and then disabling said multiplexer means so as to decouple said common data out lines from said bit lines, and resuming said precharging step;

whereby said common data out lines begin precharging before the end of each memory read cycle.

* * * * *